US007230304B2

(12) United States Patent
Kikuchi et al.

(10) Patent No.: US 7,230,304 B2
(45) Date of Patent: Jun. 12, 2007

(54) ELECTRIC CONTACTS AND METHOD OF MANUFACTURING THEREOF, AND VACUUM INTERRUPTER AND VACUUM CIRCUIT BREAKER USING THEREOF

(75) Inventors: Shigeru Kikuchi, Hitachi (JP); Masato Kobayashi, Hitachi (JP); Kenji Tsuchiya, Hitachi (JP); Noboru Baba, Hitachiota (JP); Takashi Sato, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 66 days.

(21) Appl. No.: 11/025,900

(22) Filed: Jan. 3, 2005

(65) Prior Publication Data

US 2005/0153534 A1 Jul. 14, 2005

(30) Foreign Application Priority Data

Jan. 8, 2004 (JP) ............................ 2004-002572

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/383; 257/382; 257/388; 257/768; 257/E21; 257/168

(58) Field of Classification Search ................ 257/382, 257/383, 384, 388, 412, 614, 615, 761, 762, 257/763, 764, 765, 768, 770
See application file for complete search history.

(56) References Cited

U.S. PATENT DOCUMENTS

| | | | | |
|---|---|---|---|---|
| 4,303,480 | A * | 12/1981 | Wood et al. | 361/748 |
| 4,942,076 | A * | 7/1990 | Panicker et al. | 428/137 |
| 5,082,741 | A * | 1/1992 | Taira et al. | 428/469 |
| 5,769,430 | A * | 6/1998 | Udagawa | 277/592 |
| 6,248,969 | B1 * | 6/2001 | Komuro et al. | 218/118 |

FOREIGN PATENT DOCUMENTS

| | | |
|---|---|---|
| CN | 1381857 A | 11/2002 |
| JP | 10-223075 | 8/1998 |
| JP | 2000-235825 | 8/2000 |
| JP | 2000235825 | 8/2000 |
| JP | 2001-135206 | 5/2001 |
| JP | 2002-245907 | 8/2002 |
| JP | 2002-245908 | 8/2002 |
| JP | 2002-313196 | 10/2002 |
| JP | 2003-22834 | 8/2003 |

* cited by examiner

*Primary Examiner*—David Nhu
(74) *Attorney, Agent, or Firm*—Mattingly, Stanger, Malur & Brundidge, P.C.

(57) ABSTRACT

An electric contact member which is excellent in voltage-proof performance and melt-resistant performance and excellent in mass productivity, and a method of manufacturing thereof, and a vacuum interrupter, a vacuum circuit breaker and a load-break switch for a road side transformer using thereof. The contact member is composed of a base member made of high conductive metal, and a contact layer made of refractory metal and high conductive metal, and the contact layer is formed of a plurality of thermal sprayed layers.

15 Claims, 4 Drawing Sheets

ELECTRIC CONTACTS AND METHOD OF MANUFACTURING THEREOF, AND VACUUM INTERRUPTER AND VACUUM CIRCUIT BREAKER USING THEREOF

BACKGROUND OF THE INVENTION

The present invention relates to a novel electronic contact member and Manufacture thereof, and a vacuum interrupter, a vacuum circuit breaker, a load-break switch or the like using thereof.

It is required that an electric contact member has, for example, a voltage-proof performance and a melt-resistance function. In order to satisfy the above-mentioned requirement it is effective that the texture of a material of the contact member is fine and homogeneous, and accordingly, as disclosed in JP-A-10-223075, an electron beam or a laser beam having a high energy is irradiated onto the outer surface of an electric contact so as to melt and quench the surface of the contact in order to micro-structure the texture of the electric contact. Further, JP-A-2000-235825 discloses a thermal spraying process for manufacturing an electric contact member with the use of a melting and quenching process.

In a method disclosed in the JP-A-10-223075 in which the outer surface of an electric contact is melted by an electron beam or a laser beam and is then quenched so as to have a microstructure, atmospheric control for producing various beams is required, and accordingly, an equipment such as a chamber container or the like is required. Further, since a base member for the electric contact is first produced, and is then surface-treated, two process steps are inevitably required, resulting in an increase in the manufacturing costs. Further, since the diameters of various beams have a limitation, a huge time is required for the surface treatment over a wide area, thus, the productivity cannot be so high.

In a manufacturing method as disclosed in the JP-A-2000-235825 utilizing thermal spraying, although the productivity is excellent, the structure of a thermally sprayed layer serving as an electric contact member is composed of flat particles having a relatively large particle size, and accordingly, its voltage-proof is insufficient in such a condition that the contact surface is directly used as it is after the thermal spraying. Thus, after the electric contact is incorporated in a vacuum interrupter, there is required such a conditioning treatment that electric discharge is made across a gap defined between electrodes so as to remove a low voltage-proof part, thereby it hinder cost reduction.

SUMMARY OF THE INVENTION

An object of the present invention is to provide an electric contact member which is excellent in voltage-proof function and in melt-resistant performance, and as well excellent in productivity, a method manufacturing thereof, a vacuum interrupter and a vacuum circuit breaker.

According to the present invention, there is provided an electric contact member having a base member made of highly conductive metal or the like, and a contact layer made of refractory metal or highly conductive metal, characterized in that the contact layer is lamination of a plurality layers which are thermally sprayed layers.

It is preferable to form the thermally sprayed layers of a plurality of lines.

The number of the thermally sprayed layers is in a range from 5 to 30, and the width of the lines is in a range from 5 to 30 cm per/path, and further, the refractory metal preferably contains not less than 90% of flat particles which are flat in the laminating direction of the thermally sprayed layers, and 2 to 5 wt. % of fine particles having a particle size of not greater than 5 μm.

The flat particles having a flat shape has a ratio between size and thickness, which is a value from 5 to 40, and further, the diametrical direction of the flat particles is preferably oriented in an angular range from +40 to −40 deg.

Further, the contact layer according to the present invention is composed of 15 to 40 wt. % of refractory metal and 60 to 85 wt. % of high conductive metal, and the refractory metal is preferably a mixture of not less than one or two kinds of materials selected from a group consisting of Cr, W, Mo, Ta, Nb, Be, Hf, Ir, Pt, Zr, ti, Si, Rh and Ru, or an alloy thereof while the high conductive metal is preferably Cu or a highly conductive alloy mainly composed of Cu.

As the refractory metal, Cr is in particular preferable, and is further preferable if it contains one kind selected from a group consisting of Nb, V, Fe, Co. Further, the contact layer according to the present invention, may contain as the melt-resistant metal, 0.1 to 1 wt. % of not less than one or two kinds materials selected from a group consisting of Pb, Bi, Te and Sb.

As stated above, the electric contact member according to the present invention has a Cu base member, and a contact layer formed of refractory metal and high conductive metal, and the contact layer has a structure containing flat particles of refractory metal and fine particles having a particle size of not greater than 5 μm. It is preferable that the flat particles are oriented in parallel with the contact surface.

Thus, the exposed area of the refractory metal particles at the contact surface can be increased, and accordingly, the voltage-proof performance can be enhanced while a high specific conductance can be maintained without increasing the quantity of refractory metal, and further, since electrodes can be separated and opened by a small operating force even though the electrodes are fused by arc heating upon cutoff of current, the melt-resistant performance can be enhanced. Further, since the fine particles are uniformly dispersed, a microstructure can be obtained, thereby it is possible to exhibit a proof-voltage performance without necessity of conditioning treatment.

The ratio between particle size and thickness of the flat particles in the contact layer is preferably set to a value in a range from 5 to 40. If it is smaller than 5, the above-mentioned effect can hardly obtained, and if it is exceed 40, the electric conductivity becomes lower and further, the manufacture thereof is difficult. The diametrical direction of the flat particles is desirably oriented in an angular range between +40 and −40 with respect to the contact surface. With this configuration, the above-mentioned both voltage-proof perfomance and melt-resistance performance can be obtained. The blend ratio between the refractory metal and the high conductive metal is such that 15 to 40 wt. % of the refractory metal and 60 to 85 wt. % of the high conductive metal are blended. Thus, it is possible to obtain an electric contact member having a cut-off performance and a voltage-proof performance which are excellent.

It is preferable to set the thickness of the contact layer in the electric contact member to a value in a range from 0.2 to 3 mm. If it is thinner than 0.2 mm, the function of the contact layer is poor, but if it is thicker than 3 mm, large residual stress during manufacture thereof becomes larger, it would be soon peel off. Further, the content of oxygen in the contact layer is set to be not greater than 4 wt. %, and desirably set to a value in a range from 0.3 to 4 wt. %. If it is larger than 4 wt. %, a discharge quantity of oxygen gas upon cut-off of current becomes larger, and a faults such as impossible cut-off, lowering of voltage-proof performance or the like would be caused.

According to the present invention, the electric contact member is manufactured by thermally spraying a mixed powder of the refractor metal and the high conductive metal on to a surface, serving as a contact, of the high conductive metal which is preferably a Cu base material. With this manufacture, the refractory metal and the high conductive metal are thermally sprayed in a uniformly melted condition, and is then quenched so as to obtain a contact layer having a structure, as stated above, containing the refractory metal flat particles and fine particles having a particle size of not greater than 5 μm. Further, as the atmosphere of thermal spraying, the atmosphere or a reduced pressure atmosphere is used so as to facilitate the control of the content of gas such as oxygen or the like.

Specifically, the method of manufacturing an electric contact member according to the present invention is characterized in that a plurality of layers are formed through a plurality of lines by thermally splaying a mixed powder of the refractory metal and the high conductive metal onto a base metal composed of high conductive metal. It is preferable to carry out the thermal spraying in the atmosphere or a reduced pressure atmosphere.

The contact member according to the present invention is heat-treated at a temperature in a range from 800 to 1,000 deg. C. under vacuum so as to precipitate oxygen and impurities solid-solved in the high conductive metal, thereby it is further enhance the electric conductivity. The electric contact member according to the present invention is incorporated as a stationary electrode and a movable electrode into a vacuum interrupter, and the thus obtained vacuum interrupter is, in turn, incorporated into a vacuum circuit breaker, thereby it is possible to obtain a vacuum circuit breaker and various vacuum break switches, which are excellent in voltage-proof performance and melt-resistance performance and which are inexpensive.

The electric contact member according to the present invention is formed in its center part with a through-hole, and is further formed in its central part where the stationary electrode and the movable electrode make contact with each other, with a true-circular recess. The electric contact member according to the present invention, is joined to a rod-like electrode having a protrusion which is fitted and brazed in the through hole formed in the center part of the electric contact member. Further, the electric contact member according to the present invention is formed therein with a plurality of slit grooves such as spiral or straight through-channels so as to have an impeller-like planer shape in the opposed surfaces of the stationary electrode and the movable electrode. The number of the slit grooves is preferably from 3 to 6. The slit grooves thus formed enables an arc caused upon cut-off of current to run from the center to the outer periphery thereof without concentration to one point on the electrode, thereby it is possible to enhance the durability of the electrodes.

According to the present invention, there is provided a vacuum interrupter comprising a stationary electrode and a movable electrode in a vacuum container, is characterized in that the opposed surfaces of the stationary electrode and the movable electrode are each formed of the electric contact members as stated above.

It is preferable to subject the stationary electrode and the movable electrode to press-plastic working through repetitions of opening and closing of the opposed surfaces thereof under no load condition.

According to the present invention, there is provided a vacuum circuit breaker composed of a vacuum valve comprising a stationary electrode and a movable electrode in a vacuum container, each of the stationary electrode and the movable electrode in the vacuum container being provided with an opening and closing means for driving the movable electrode through the intermediary of an insulation rod connected outside of the vacuum interrupter, characterized in that the vacuum interrupter is the vacuum interrupter as stated above.

Further, according to the present invention, there is provided a load-break switch for a road side transformer, comprising three vacuum interrupters each incorporating a stationary electrode and a movable electrode in a vacuum container, an outer vacuum container which accommodates therein the three vacuum interrupters having their movable electrodes which are connected respectively to outer bellows and their stationary electrodes which are connected respectively to insulation bushings, and flexible conductors which are electrically connect the three vacuum interrupters with one another, characterized in that each of the vacuum interrupters are the vacuum valve as stated above.

The stationary electrode and the movable electrode are subjected at their opposed surfaces to either press-plastic working with the repetitions of opening and closing under no load condition, or to conditioning treatment with the repetitions of opening and closing under no load condition.

According to the present invention, there can be provided an electric contact member which is excellent in voltage-proof performance and melt-resistant performance, and excellent in mass-productivity, a method of manufacturing thereof, and a vacuum interrupter, a vacuum circuit breaker and a load-break switch for a road side transformer, using the electric contact member.

Other objects, features and advantages of the invention will become apparent from the following description of the embodiments of the invention taken in conjuction with the accompanying drawings wherein:

DESCRIPTION OF PREFERRED EMBODIMENTS OF THE INVENTION

Figure 1A:
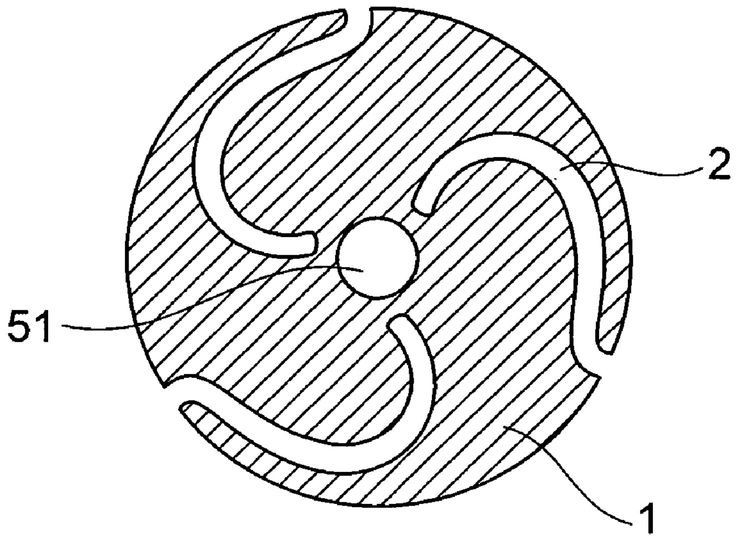
FIGS. 1A and 1B are sectional views illustrating an electrode for a vacuum interrupter, according to the present invention.

Detailed explanation will be hereinbelow made of preferred embodiments of the present invention although the present invention should not be limited to these embodiment.

REFERENCE EXAMPLE 1

Referring to FIG. 1 is a sectional view illustrating an electrode for a vacuum interrupter using an electric contact member according to the present invention, the vacuum interrupter electrode has a contact layer 1, spiral channels 2 for applying a driving force to an arc so as to prevent the arc from stagnating, a reinforce plate 3 made of nonmagnetic stainless steel, an electrode rod 4, a brazing material 5, a Cu base member 50 and a center hole 51 which defines a recess which prevents an arc from generating in the center of the electrode. The vacuum interrupter electrode is formed of an electric contact member having a contact layer formed by thermally spraying Cu which is high conductive metal and Cr which is refractory metal onto the outer surface of the Cu base member 50. The electrode rod 4 has a back conductor 44 having a diameter smaller than that of a part for external connection.

The electric contact member is manufactured by a method as follows:

Cu powder having a particle size of not greater than 61 μm (89% of powder having a particle size of not greater than 45 μm), and Cr powder having a particle size of not grater than 104 μm (58% of powder having a particle size of not greater than 45 μm) were mixed in a V-type mixer at a blend ratio with which a desired contact composition can be obtained. The thus obtained mixed powder was thermally sprayed onto the Cu base member 50 which had been machined beforehand into a desired contact member shape, by a plasma thermal spraying process under the atmosphere or a reduced pressure atmosphere so as to obtain the contact layer 1. At this time, thermal spraying conditions including a plasma output power, a gas flow rate, a powder supply quantity, the atmosphere and the like were adjusted so as to obtain a desired contact composition, oxygen content and thickness.

Electrolytic powder having a particle size of not greater than 61 μm and a purity of 99.99% and chromium powder having a particle size of not greater than 104 μm and a purity of 99.99% were mixed in the V type mixer at a blend ratio shown in Table 1 which will be explained later, at a speed of 1,500 rpm for one hour so as to obtain a mixed powder which was then thermally sprayed onto the Cu base member 50 formed of an oxygen-free copper plate by a plasma thermal spraying process. With thermal spraying conditions such as plasma gas Ar+H2, plasma current 600 A, plasma voltage 60V, powder supply quantity 36 g/min, thermal spraying distance 100 mm, a film (layer) thickness 0.1 to 0.5 mm, width 2 to 3 cm/path, 1 to 40 of thermally sprayed layers were formed. After the thermal spraying, the contact layer 1 and the Cu base member 50 were heat-treated for one hour at a temperature from 800 to 1,000 deg. C. under vacuum of $1.3\times10^{-3}$ Pa.

TABLE 1

| | Contact Layer | | | | | | Results of Cut-off Test | | | |
|---|---|---|---|---|---|---|---|---|---|---|
| No. | Thickness (mm) | Blend Compositions (wt. %) Cu | Cr | Oxygen Content (wt. %) | Size/Thickness Ratio of Flat Particles | Fine Particles having Particle Size of not greater than 5 μm | Conditioning (Gap 6 mm, 65 kV) | Cut-off Performance | Voltage-Proof Performance | Melt-Resistant Performance |
| 1 | 2 | 75 | 25 | 3 | 7~35 | Presence | Nothing | 1 | 1 | 1 |
| 2 | 2 | 85 | 15 | 3 | 8~30 | Presence | Nothing | 1 | 0.9 | 0.9 |
| 3 | 2 | 60 | 40 | 3 | 7~35 | Presence | Nothing | 0.95 | 1.2 | 1.2 |
| 4 | 2 | 75 | 25 | 4 | 45~ | Presence | Nothing | 0.7 | 1.4 | 1.2 |
| 5 | 2 | 75 | 25 | 1.5 | 2~4 | Nothing | Nothing | 1 | 0.8 | 0.7 |
| 6 | 2 | 75 | 25 | 0.8 | 5~10 | Nothing | Nothing | 1 | 0.8 | 0.9 |
| 7 | 2 | 75 | 25 | 0.8 | 5~10 | Nothing | Presence | 1 | 1 | 0.9 |
| 8 | 0.1 | 75 | 25 | 3 | 7~35 | Presence | Nothing | 1 | 0.8 | 0.8 |
| 9 | 4 | 75 | 25 | 3 | 8~40 | Presence | Nothing | — | — | — |
| 10 | 2 | 75 | 25 | 4.5 | 20~40 | Presence | Nothing | 0.8 | 0.7 | 1 |
| 11 | 2 | 90 | 10 | 3 | 8~35 | Presence | Nothing | 0.9 | 0.8 | 0.8 |
| 12 | 2 | 55 | 45 | 3 | 7~37 | Presence | Nothing | 0.85 | 1.3 | 1.25 |
| 13 | 2 | 75 | 25 | 0.2 | 1~1.3 | Nothing | Presence | 1 | 0.9 | 0.9 |

Table 1 exhibits properties of contact layers of electric contact members (No. 1 to No. 12) which are formed by the thermal spraying process, that is, a thickness, a composition, a structure, an oxygen content, a ratio between particle size and thickness of Cr flat particles (size/thickness), and a result of a cut-off test which will be explained later. In this reference example, there were produced, by the thermal spraying process, Nos. 1 to 12 of electric contact members each having a contact layer with the ratio between particle size and thickness of Cr flat particles (size/thickness) is in a range from 2 to 50, the oxygen content in a range from 0.2 to 4.5 wt. % and the thickness in a range from 0.1 to 4 mm, and No. 13 of an electric contact member having a contact layer 1 formed by sintering. Nos. 1 to 4 and 8 to 12 were obtained by thermal spraying under the atmosphere, and Nos. 5 to 7 were obtained under a reduced pressure atmosphere. Further, in Table 1 after observation through a microscope having a high magnifying power, "Presence" indicates that 2 to 5 wt. % of fine Cr particles having a particle size of not greater than 5 μm were contained, and "nothing" indicates less than that thereof. All of "nothing" were obtained by the thermal spraying under a reduced pressure atmosphere, having a large thickness per layer, but a low jet speed and a low cooling speed during thermal spraying. Thus, the flat shape ratio of Cr particles is small.

Further, in this reference example, the lines of each thermal sprayed layer was formed by a thin thickness, and accordingly, each layer could be rapidly cooled. Thus, fine Cr particles having a particle size of not greater than 5 μm were formed in a flat shape so that the flat surfaces of the Cr fine particles were exposed much more from the outer surface of the electrode, thereby it is possible to remarkably enhance the strength of all Cr content as refractory metal, and to enhance the surface density of Cr content at the opposed surfaces of the electrodes with respect to all Cr quantity as refractory metal, thereby it is possible to obtain the one which is excellent in voltage-proof performance and melt-resistant performance.

It is noted that in any of Nos. 1 to 12 of the contact layers produced by the thermal spraying process, the flat particles of the refractory metal was oriented in an angular range between −40 to +40 with respect to the contact surface.

In the reference example, Cr was used as the refractory metal, other than Cr, a mixture of not less than one or two kinds of W, Mo, Ta, Nb, Be, Hf, Ir, Pt, Zr, Si, Rh and Ru or an alloy thereof can be used for producing the contact layer in the case of using Cu as the high conductive metal.

REFERENCE EXAMPLE 2

Figure 1B:
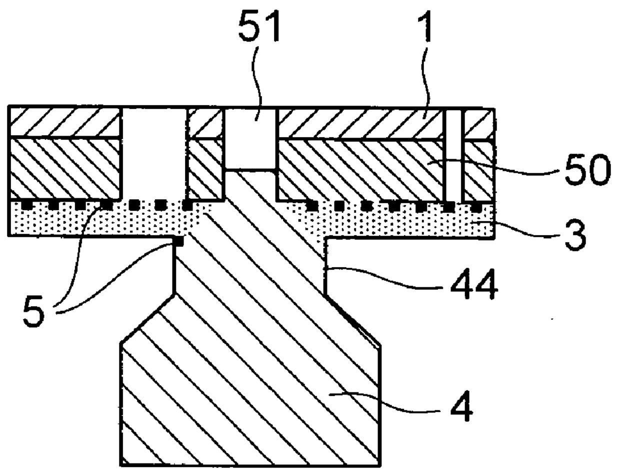

An electrode was assembled by a method as follows: The electric contact member obtained in the reference example was formed therein with spiral channels 2 and a center hole 2 as shown in FIG. 1A by cutting the contact member in a flat shape. Further, the electrode surface of the contact layer 1 was remained as it was after thermal spraying. Oxygen-free copper was used for the electrode rod 4 and SUS304 was used for the reinforce plate 3, and were formed beforehand as shown in FIG. 1B by machining. Then, the protrusion of the electrode rod 4 was inserted in the center hole 51 of the electric contact member having a contact layer 1 and composed of the Cu base member 50 through the intermediary of the center hole 51 of the reinforce plate 3, and was fitted by means of the brazing material. Further, a brazing material 5 was interposed between the Cu base member 50 and the reinforce plate 3 which were then heated at a temperature of 980 deg. C. for 8 min under vacuum of not higher than $8.2\times10^{-4}$ Pa. Thus, the electrode shown in FIG. 1 was obtained. This electrode was used in a vacuum interrupter having a rated voltage of 7.2 kV, a rated current of 600 A and a rated cut-off current of 20 kA. It is noted that the reinforce plate 3 can be eliminated if the strength of the Cu base member 50 is high.

Figure 2:
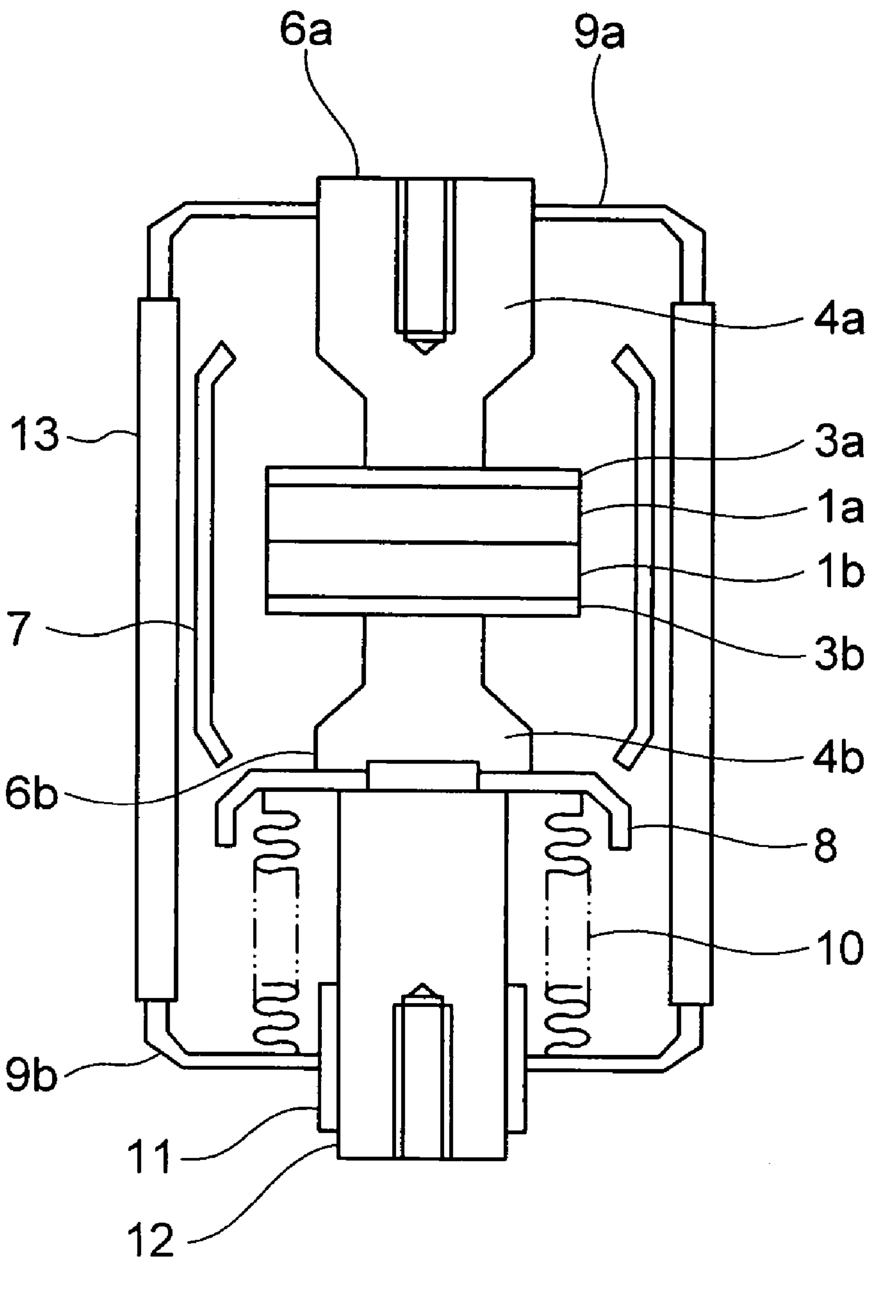
FIG. 2 is a sectional view illustrating a vacuum interrupter according to the present invention.

Referring to FIG. 2 which is a sectional view illustrating the structure of the vacuum interrupter in this reference example, the electrode obtained as stated above was used for producing the vacuum interrupter. The specification of the vacuum valve was as follows: a rated voltage of 7.2 kV, a rated current of 600 A, a rated cut-off current of 20 kA. As shown in FIG. 2, the vacuum interrupter comprised a stationary electric contact 1A, a movable electric contact 1B, reinforce plates 3*a*, 3*b*, a stationary electrode rod 4*b* and a movable electrode rod 4*b*, that is, respectively having stationary electrode 6*a*, and the movable electrode 6*b*. The movable electrode 6*b* was brazed and joined to a movable holder 12 through the intermediary of a movable shield 8. These were brazed under high vacuum by a stationary end plate 9*a*, a movable end plate 9*b* and an insulation cylinder 13, and were connected to an external conductor through the stationary electrode 6*a* and a thread part of the movable holder 12. A shield 7 for preventing metal vapor from scattering upon cut-off was provided at the inner surface of the insulation cylinder 13, and further, a guide for supporting a slide part was provided between the movable end plate 9*b* and the movable holder 12. Further, bellows 10 were provided between the movable shield 8 and the movable end plate 9*b*, and accordingly, the movable holder 12 was moved up and down while vacuum was maintained in the vacuum interrupter in order to open and close the stationary electrode 6*a* and the movable electrode 6*b*.

REFERENCE EXAMPLE 3

Figure 3:
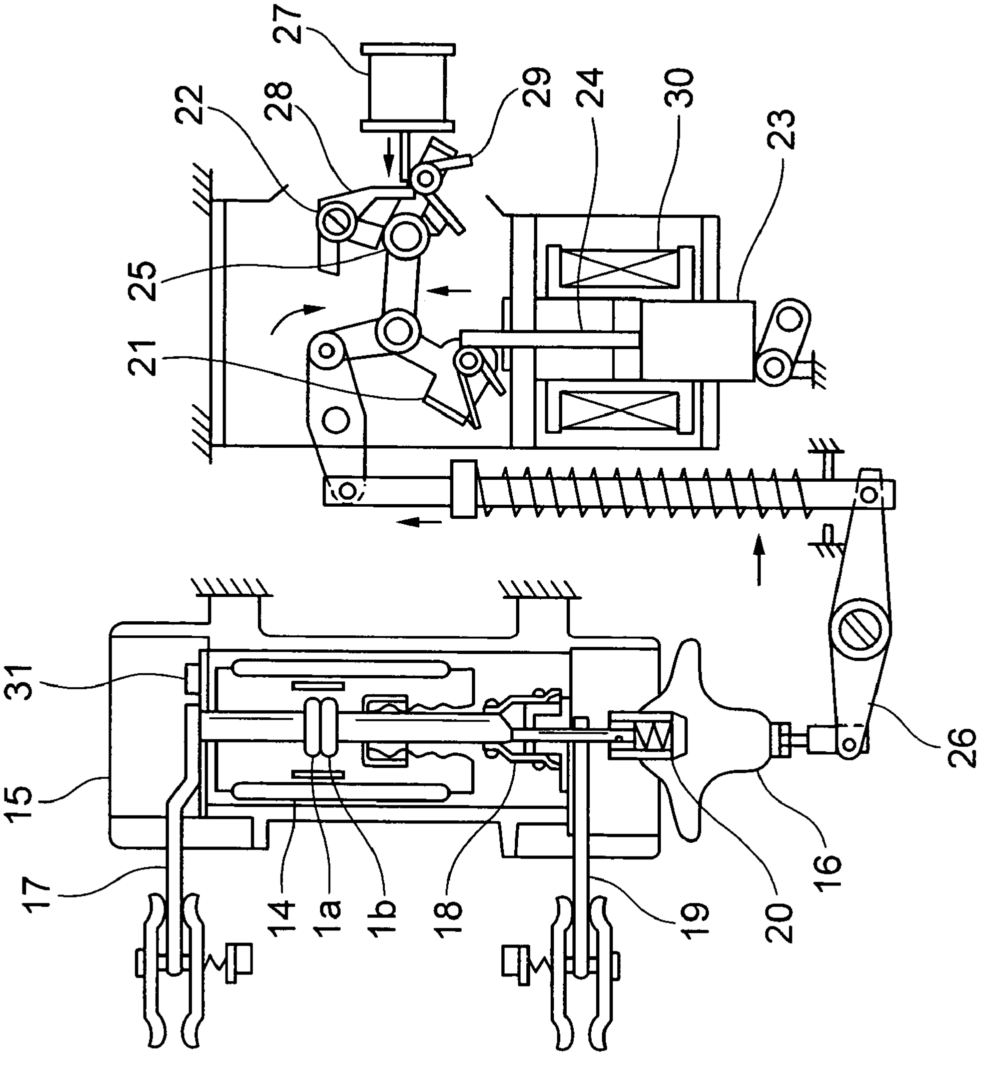
FIG. 3 is a sectional view illustrating a vacuum circuit breaker according to the present invention.

Referring to FIG. 3 which shows a configuration of a vacuum circuit breaker composed of the vacuum interrupter according to the present invention and an operating mechanism therefor, the vacuum circuit breaker was produced by installing the vacuum interrupter shown in FIG. 2. The vacuum circuit breaker was composed of an operating mechanism located on the front side and three 3-phase build-in type epoxy cylinders 15 each for supporting the vacuum interrupter 14, located on the rear side. The vacuum interrupter was opened and closed by the operating mechanism through the intermediary of an insulation operating rod 16.

When the vacuum circuit breaker is closed, current runs through an upper terminal 17, the electric contact 1, and a current collector 18 and a lower terminal 19. The contacting force between the electrodes is held by a contacting spring 20 fitted on the insulation operating rod 16. The contacting force between the electrodes and an electromagnetic force by a short-circuit current are held by a support lever 21 and a prop 22. When a turn-on coil 30 is excited, a plunger 23 pushes up a roller 25 through the intermediary of a knocking rod 24 from a closed condition, so as to turn a main lever 26 in order to close the electrodes which are thereafter held by the support lever 21. When the vacuum circuit breaker is in a condition in which it is free to be pulled out, a pull-out coil 27 is excited so as to cause a pull-out lever 28 to disengage the prop 22, and thus, the main lever 26 is turned so as to open the electrodes. When the vacuum circuit breaker is opened, after the electrodes are opened, the link is returned by a reset spring 29, and simultaneously, the prop 22 is engaged. In this condition, when the turn-on coil 30 is excited, a closed condition is set up. It is noted that reference numeral denotes an exhaust cylinder.

In this embodiment, with 50 times of repetitions of opening and closing in a no load condition by the vacuum circuit breaker as shown in FIG. 3 without application of current and voltage, the contact layers of the stationary electrode rod 4*a* and the movable electrode rod 4*b* were subjected to plastic deformation by pressing due to repeated opening and closing, and as a result, the contact layers of the stationary electrode 4*a* and the movable electrode 4*b* had dense structures and as well enhanced strengths in comparison with those just after the thermal spraying. Further, the outer surface of the contact layer became smoother in comparison with that just after thermal spraying. Thereby it was exhibited that the cut-off characteristic is further enhanced.

Next, with the use of this vacuum circuit breaker, a cut-off test was carried out with a rated voltage of 7.2 kV, a rated current of 600 A, a rated cut-off current of 20 kA. The result of the test is shown in Table 1 as stated above. During the cut-off test, No. 13 of the electric contact member produced by sintering was also tested for comparison. Their performances are exhibited relative to the No. 1 of the electric contact member which is set to 1.

As to No. 2 of the contact member containing 15 wt. % of Cr and No. 3 of the contact member containing 40 wt. % of Cr, can be used practically with no hindrance although there is such a tendency that the voltage-proof performance and the melt-resistant performance are lowered with less amount of Cr, but the cut-off performance is lowered with larger amount of Cr. Thus, they have satisfactory characteristic together with No. 1 of the contact member.

On the contrary, as to No. 11 of the contact member containing 10 wt. % of Cr which is less than 15 wt. %, the voltage-proof performance and the melt-resistant performance is in particular remarkably lowered, and further, as to No. 12 of the contact member containing 45 wt. % of Cr, which is larger than 40 wt. %, the cut-off performance is lowered, there would be caused a risk of impossible cut-off.

As to No. 4 of the electric contact member in which the value of the ratio (size/thickness) between particle size and thickness of the refractory metal flat particles is not less than 45 greater than 40, the energizing function is lowered, and the cut-off performance is remarkably poor. Further, as to No. 5 of the electric contact member having a value of the size/thickness ratio in a range from 2 to 4, which is less than 5, the degree of powder melting is low and no fine particle is present, and accordingly, the voltage-proof performance and melt-resistant performance are low.

As to No. 6 of the electric contact member in which an extremely less quantity of refractory metal fine particles is contained in the contact layer, the voltage-proof performance and the melt-resistant performance are lowered, that is, it can hardly have practically usable performances with no conditioning treatment which incurs huge time. However, as to No. 7 of the electric contact member which was subjected to conditioning treatment in which energization and deenergization was repeated with a gap 6 mm and 65 kV, the voltage-proof performance is enhanced up to 1 so as to obtain a practically usable performances. Further, as to No. 8 of the electric contact member having a thickness of the contact layer which is 0.1 mm less than 0.2 mm, the voltage-proof performance and the melt-resistant performance are both lowered, there would be caused a risk of exposure of the Cu base member as the base material through arc heating upon cut-off. Further, No. 9 of the electric contact member having a thickness of the contact layer which is 4 mm larger than 3 mm, the contact layer was peeled off due to residual thermal stress after thermal spraying, the cut-off test could not be completed.

As to No. 10 of the electric contact member having 4.5 wt. % of content of oxygen, which is greater than 4 wt. %, the gas discharge quantity becomes larger upon cut-off, the cut-off performance and the voltage-proof performance are remarkably lowered to 0.8 and 0.7, respectively, but the one having 0.5 to 4 wt. % of content of oxygen, lowering of the cut-off performance and the voltage-proof performance is less.

No. 13 of the electric contact member formed by sintering can only just have performances substantially equivalent to those of the electric contact member according to the invention even though it is subjected to conditioning treatment which requires a huge time. Accordingly, it is understood that the electric contact member according to the present invention can have the voltage-proof performance and the melt-resistant performance which are excellent with no conditioning treatment, at low costs.

Further, effects similar to that using Cr can be obtained with a mixture of not less than one or two kind of W, Mo, Ta, Nb, Be, Hf, Ir, Pt, Zr, Ti, Si and Ru or an alloy thereof in the case of using a Cu alloy as the high conductive metal. Thus, it is demonstrated that the electric contact member according to the present invention can have the voltage-proof performance and the melt-resistant performance which are excellent.

As stated above, in this reference example, there can be provided an electric contact member having a voltage-proof performance and a melt-resistant performance which are excellent, and having an excellent mass productivity, a method manufacturing thereof, and a vacuum interrupter and a vacuum circuit breaker using thereof.

REFERENCE EXAMPLE 4

Figure 4:
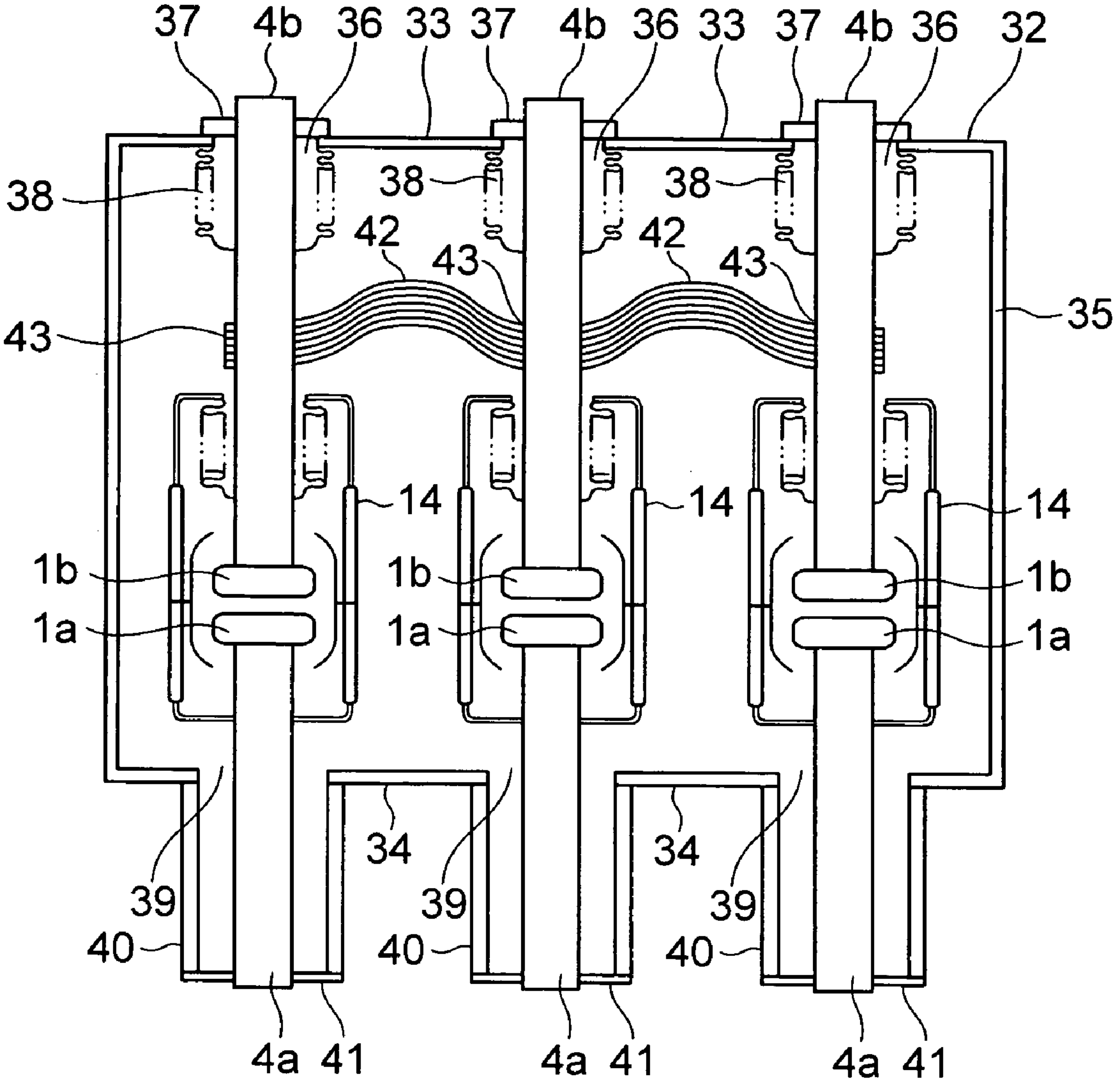
FIG. 4 is a sectional view illustrating a load-break switch for a road side transformer, according to the present invention.

Referring to FIG. 4 which is a sectional view illustrating a load-brake switch for a road side transformer, according to the present invention as a reference example 4, in this example, the vacuum interrupter produced in the reference example 1 was set in the vacuum circuit breaker in the reference example 3, and then the opening and closing of the circuit breakers were repeated by about 50 times in the above-mentioned no load condition. Thereafter, the vacuum interrupter was removed from the vacuum circuit breaker, and then was installed in the load-break switch for a road side transformer. In this load-brake switch, a plurality of vacuum interrupters 14 corresponding to a main circuit switching portion were accommodated in an outer vacuum container 32 vacuum-sealed. The outer vacuum container 32 was composed of an upper plate member 33, a lower plate member 34 and side plate members 35, the plate members being welded at their peripheries (edges) together, and were installed together with the installation body.

The upper plate member 33 was formed therein with upper through holes 36 having their peripheral edges fitted therein with annular insulation upper bases 37 so as to cover the through holes 36. Further, a circular hollow space formed at the center of each of the upper bases 37 was reciprocally (up and down) inserted therein with a columnar movable electrode rod **4*b*. That is, each of the through holes 36 was plugged by the upper base 37 and the movable electrode rod 4*b***.

The axially one end part (upper side) of the movable electrode rod **4*b*, was connected to an actuator (electromagnetic actuator) externally arranged. Further, on the lower side of the upper plate member 33, outer bellows 38 were reciprocally arranged along the peripheral edges of the upper through holes 36. Each of the bellows 38 had an axially one side end which is secured to the lower side of the upper plate member 33, and an axially the other end which was fitted to the outer peripheral surface of each of the movable electrodes 4*b*. That is, since the outer vacuum container 32 had a sealed structure, the outer bellows 38 were arranged at the peripheral edges of the respective upper through holes 36 along the axial direction of the movable electrode rods 4*b*. Further, the contra layer of each electric contact member in this reference example, had a thickness of 0.2 to 3 mm and not less than 0.3 to 4 wt. % of oxygen content, similar to the reference example 1. Further, the upper plate member 33 was coupled thereto with an exhaust pipe (which is not shown), and the outer vacuum container 32** was vacuum-evacuated through this exhaust pipe.

Meanwhile, lower through-holes 39 were formed in the lower plate member 34, and were fitted therein at their peripheral edges with insulation bushings 40 so as to cover the lower through holes 39. Each of the insulation bushings was fixed thereto in its lower part with an annular lower insulation base 41. Further, the columnar stationary electrode rod **4*a* was inserted in a center circular space in each of the lower bases 41. That is, each of the lower through holes 39 formed in the lower plate member 34 was plugged by the insulation bushing 40, the lower base 41 and the stationary electrode rod 4*a*. Further, an axially one end side (lower side) of the stationary electrode rod 4***a* was coupled to a cable (power wiring) located outside of the outer vacuum container 32.

The vacuum interrupters 14 corresponding to the main circuit break switch portion of the load break switch were accommodated in the outer vacuum container 32, and the movable electrode rods 4*b* were coupled to one another through the intermediary of a flexible conductor 42 having two curved parts. The flexible conductor 42 was composed of copper plates and nonmagnetic stainless steel plates as conductor plates, having two curved parts in the axial direction thereof, which were alternately stacked one upon another. The flexible conductor 42 is formed therein with through holes 43 which were respectively inserted therein with the movable electrode rods 4*b* that were therefore coupled to one another.

According to the reference example, similar to the reference example 3, there can be provided a load-break switch for a road side transformer, which is excellent in voltage-proof performance and melt-resistant performance. Further, it is clear that the vacuum interrupter in this reference example, can be applied to the load-break switch for a road side transformer, and also can be also applied to other various vacuum switches including a vacuum-insulation switch gear.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electric contact member comprising:

a base member made of high conductive metal, and a contact layer made of refractory metal and high conductive metal, wherein the contact layer is composed of a plurality of thermal sprayed layers, and wherein the refractory metal contains flat particles having a ratio between particle size and thickness in a range from 5 to 40.

2. An electric contact member comprising:

a base member made of high conductive metal, and a contact layer made of refractory metal and high conductive metal, wherein the contact layer is composed of a plurality of thermal sprayed layers, and wherein not less than 90 wt. % of the refractory metal contains flat particles having a flat shape in a laminating direction of the thermal sprayed layers, and 2 to 5 wt. % of fine particles having a particle size of not greater than 5 μm.

3. An electric contact member as set forth in claim 2, wherein the flat particles have flat surfaces which are oriented in an angular range between −40 and +40 deg. with respect to a surface serving as a contact.

4. An electric contact member as set forth in claim 2, wherein the contact layer is composed of 15 to 40 wt. % of the refractory metal and 60 to 85 wt. % of the high conductive metal.

5. An electric contact member as set forth in claim 1, wherein the refractory metal is a mixture of more than one or two kinds of Cr, W, Mo, Ta, Nb, Be, Hf, If, Pt, Zr, Ti, Si, Rh and Ru or an alloy thereof.

6. An electric contact member as set forth in claim 1, wherein the high conductive metal is made of Cu, or a Cu based alloy.

7. An electric contact member as set forth in claim 1, wherein thickness of the contact layer is in a range from 0.2 to 3 mm.

8. An electric contact member comprising:

a base member made of high conductive metal, and a contact layer made of refractory metal and high conductive metal, wherein the contact layer is composed of a plurality of thermal sprayed layers, wherein content of oxygen in the contact layer is not greater than 4 wt. %.

9. An electric contact member comprising:

a base member made of high conductive metal and a contact layer made of refractory metal and high conductive metal, wherein the contact layer composed of thermal sprayed layers, and not less than 90 wt. of the refractory metal contains flat particles having a flat shape in a direction of lamination of the thermal sprayed layers, and 2 to 5 wt. % of fine particles having a particle size of not greater than 5 μm.

10. A vacuum interrupter incorporating a stationary electrode and a movable electrode in a vacuum container, wherein a stationary electrode and the movable electrode have surfaces which are opposed to each other, and each of the stationary and movable electrodes is formed of an electric contact member comprising:

a base member made of high conductive metal, and a contact layer made of refractory metal and high conductive metal, wherein the contact layer is composed of a plurality of thermal sprayed layers.

11. A vacuum interrupter as set forth in claim 10, wherein the opposed surfaces of the stationary electrode and the movable electrode are subjected to press-plastic working.

12. A vacuum circuit breaker comprising:

a vacuum interrupter including a stationary electrode and a movable electrode in a vacuum container, which are respectively provided with opening and closing means for driving the movable electrode by means of insulation rods connected externally of the vacuum interrupter, wherein the vacuum interrupter is as set forth in claim 10.

13. A vacuum circuit breaker as set forth in claim 12, wherein the stationary electrode and the movable electrode are subjected at their opposed surfaces to at least one of press-plastic working with repetitions of opening and closing under no load condition and conditioning treatment with repetitions of opening and closing under no load condition.

14. A load-break switch for a road side transformer comprising:

three vacuum interrupters each includes:

a stationary electrode and a movable electrode in a vacuum container, the movable electrodes in the three vacuum interrupters being connected to outer bellows, respectively while the stationary electrodes are connected to insulation bushings, respectively and they being accommodated in an outer vacuum container, the three vacuum interrupters being electrically connected to one another through the intermediary of a flexible conductor, wherein each of the three vacuum interrupters being a vacuum interrupter as set forth in claim 10.

15. A load-break switch for a road side transformer as set forth in claim 14, wherein the stationary electrode and the movable electrode are subjected at their opposed surfaces to at least one of press-plastic working with repetitions of opening and closing under no load condition and conditioning treatment with repetitions of opening and closing under no load condition.

* * * * *